US006337682B1

(12) United States Patent
Hwang

(10) Patent No.: US 6,337,682 B1
(45) Date of Patent: Jan. 8, 2002

(54) FLAT PANEL DISPLAY APPARATUS WITH AUTOMATIC COARSE CONTROL

(75) Inventor: Ho-Dae Hwang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/246,132

(22) Filed: Feb. 8, 1999

(30) Foreign Application Priority Data

Feb. 9, 1998 (KR) .............................................. 98-3675

(51) Int. Cl.[7] .................................................. G09G 5/00
(52) U.S. Cl. ........................ 345/213; 345/204; 345/211; 327/39; 327/47
(58) Field of Search ................................ 345/204, 211, 345/213; 327/39, 47–49

(56) References Cited

U.S. PATENT DOCUMENTS

| | | |
|---|---|---|
| 4,323,924 A | 4/1982 | Flasza |
| 4,483,599 A | 11/1984 | MacRae et al. |
| 4,484,110 A | 11/1984 | Achtstaetter |
| 4,491,925 A | 1/1985 | Richards |
| 4,777,452 A | 10/1988 | Hayami et al. |
| 4,983,924 A | 1/1991 | Hillstrom |
| 5,021,719 A | 6/1991 | Arai et al. |
| 5,130,802 A | 7/1992 | Ruprecht et al. |
| 5,155,417 A | 10/1992 | Tateishi |
| 5,247,229 A | 9/1993 | Ngo et al. |
| 5,333,019 A | 7/1994 | Okamoto |
| 5,748,252 A | 5/1998 | Draves |
| 5,805,242 A | 9/1998 | Strolle et al. |
| 5,841,430 A | * 11/1998 | Kurikko ..................... 345/213 |
| 5,841,481 A | 11/1998 | Yoshikawa |
| 6,005,557 A | * 12/1999 | Wong .......................... 345/204 |
| 6,011,534 A | * 1/2000 | Tanaka et al. ................. 345/98 |
| 6,014,177 A | * 1/2000 | Nozawa ....................... 348/540 |
| 6,160,542 A | * 12/2000 | Hwang ........................ 345/213 |
| 6,201,535 B1 | * 3/2001 | Hwang ........................ 345/213 |

* cited by examiner

Primary Examiner—Almis R. Jankus
Assistant Examiner—Henry N. Tran
(74) Attorney, Agent, or Firm—Robert E. Bushnell, Esq.

(57) ABSTRACT

A flat panel display apparatus includes a sampling clock generator for generating a sampling clock signal with a frequency corresponding to a synchronous signal supplied from a host, a phase detector for detecting the phase difference between the sampling clock signal and the synchronous signal to generate a phase difference data, a comparator for comparing the phase difference data with a delay data corresponding to the synchronous signal to generate a correction signal, a micro-controller for generating the delay data and for increasing or decreasing the frequency divisional value of the sampling clock generator to adjust the frequency of the sampling clock signal in response to the correction signal, and an analog to digital converter for converting an analog video signal into corresponding digital video signal in response to the sampling clock signal. Preferably, the sampling clock generator includes a phase locked loop (PLL) for adjusting the frequency of the sampling clock signal according to the frequency divisional value from the micro-controller. The phase detector comprises a high frequency clock generator for generating a high frequency clock signal with a higher frequency than that of the sampling clock signal, a counter for counting the high frequency clock signal, a latch for latching the output of the counter, and a flip-flop for enabling or disabling the counter and latch according as the synchronous signal or sampling clock signal is inputted.

20 Claims, 6 Drawing Sheets

FLAT PANEL DISPLAY APPARATUS WITH AUTOMATIC COARSE CONTROL

CLAIM OF PRIORITY

This application makes reference to, incorporates the same herein, and claims all benefits accruing under 35 U.S.C. §119 from an application for FLAT PANEL DISPLAY APPARATUS HAVING AUTO COARSE CONTROL FUNTION earlier filed in the Korean Industrial Property Office on the $2^{nd}$ day of February 1998 and there duly assigned Serial No. 98-3675, a copy of which is annexed hereto.

BACKGROUND OF THE INVENTION

1. Technical Field

The present invention concerns a flat panel display apparatus, and more particularly a flat panel display apparatus with an automatic coarse control.

2. Related Art

The flat panel display apparatus receives an analog video signal and synchronous signal from a host such as personal computer system to convert the analog video signal by an analog to digital converter (A/D converter) to corresponding digital video signal to display. In this case, the sampling clock signal supplied to the A/D converter varies in its frequency depending on the characteristics of the synchronous signal. Such frequency determination is generally made in compliance with the standard of VESA (Video Electronics Standards Association). VESA is an organization of video companies intended to establish a set of timing standards. Meanwhile, the flat panel display apparatus is usually provided with a coarse control to control the frequency of the sampling clock signal supplied to the A/D converter.

Computer systems are information handling systems that are utilized by many individuals and businesses today. A computer system can be defined as a microcomputer that includes a central processing unit (CPU), a volatile memory, a non-volatile memory such as read only memory (ROM), a display monitor, a keyboard, a mouse or other input device such as a trackball, a floppy diskette drive, a compact disc-read only memory (CD-ROM) drive, a modem, a hard disk storage device, and a printer. A computer system's main board, which is a printed circuit board known as a motherboard, is used to electrically connect these components together. A computer system can be a desktop computer, a portable computer such as a notebook computer or palm-sized computer, or other type of computer. The central processing unit is often described as a microprocessor. The microprocessor is an electronic component having internal logic circuitry handling most, if not all, the data processing in the computer system. The internal logic circuitry of microprocessors is typically divided into three functional parts known as the input/output (I/O) unit, the control unit, and the arithmetic-logic unit (ALU). These three functional parts interact together and determine the power and performance of the microprocessor. The combination of the control unit and the arithmetic-logic unit can be referred to as the central processing unit. Also, the combination of the input/output unit, the control unit, and the arithmetic-logic unit can be referred to as the central processing unit. One example of non-volatile memory is read only memory (ROM). Information stored in non-volatile memory can remain unchanged even when there is a power failure. The information stored in non-volatile memory will stay there until it is changed. Read only memory is used to store important information such as instructions for the central processing unit. There are different types of read only memory including electrically-erasable-programmable-read-only-memory (EEPROM) chip and flash-read-only-memory (flash-ROM). The flash-ROM can also be referred to as flash memory. Computer systems include a basic input output system (BIOS) which is an especially important program stored in read only memory. The basic input output system tests a computer every time the computer is powered on. The basic input output system can allocate a computer system's resources automatically, making adjustments needed to accommodate new hardware. Also, the basic input output system governs how system board components interact. When the computer system is powered on, the basic input output system immediately takes control of the computer system and its components. The first duty of the basic input output system is to perform a series of diagnostic routines called the power on self test (POST) routine, which ensures that every part of the computer system's hardware is functioning properly.

When a video card mounted in the host (computer system) is not in compliance with the standard of VESA, a micro-controller can not provide a correct frequency divisional value. In this case, a user may perform coarse control by manually operating a coarse control key. Also, if the frequency of the sampling clock signal is not set correctly due to some unknown problems, the coarse control key may be used to perform the coarse control. However, it is very hard for the user to manually perform such coarse control accurately and efficiently.

I have found that manual adjustments to coarse control can be inconvenient and inefficient. Efforts have been made with reference to display devices, coarse control, tracking signals, and synchronizing signals.

Exemplars of recent efforts in the art include U.S. Pat. No. 5,841,481 issued to Yoshikawa, U.S. Pat. No. 5,805,242 issued to Strolle et al., U.S. Pat. No. 5,247,229 issued to Ngo et al., U.S. Pat. No. 5,130,802 issued to Ruprecht et al., U.S. Pat. No. 4,777,452 issued to Hayami et al., U.S. Pat. No. 4,983,924 issued to Hillstrom, U.S. Pat. No. 4,484,110 issued to Achtstaetter, U.S. Pat. No. 5,748,252 issued to Draves, U.S. Pat. No. 5,333,019 issued to Okamoto, U.S. Pat. No. 5,155,417 issued to Tateishi, U.S. Pat. No. 5,021,719 issued to Arai, et. at, U.S. Pat. No. 4,491,925 issued to Richards, U.S. Pat. No. 4,483,599 issued to MacRae, et. al, and U.S. Pat. No. 4,323,924 issued to Flasza.

While these recent efforts provide advantages, I note that they fail to adequately provide a flat panel display apparatus with automatic coarse control.

SUMMARY OF THE INVENTION

It is an object of the present invention to provide a flat panel display apparatus with means to automatically perform the coarse control.

According to an embodiment of the present invention, a flat panel display apparatus comprises a sampling clock generator for generating a sampling clock signal with a frequency corresponding to a synchronous signal supplied from a host, a phase detector for detecting the phase difference between the sampling clock signal and the synchronous signal to generate a phase difference data, a comparator for comparing the phase difference data with a delay data corresponding to the synchronous signal to generate a correction signal, a micro-controller for generating the delay data and for increasing or decreasing the frequency divisional value of the sampling clock generator to adjust the frequency of the sampling clock signal in response to the correction signal, and an analog to digital converter for converting an analog video signal into corresponding digital video signal in response to the sampling clock signal. Preferably, the sampling clock generator includes a PLL for adjusting the frequency of the sampling clock signal according to the frequency divisional value from the microcontroller. The phase detector comprises a high frequency clock generator for generating a high frequency clock signal with a higher frequency than that of the sampling clock signal, a counter for counting the high frequency clock signal, a latch for latching the output of the counter, and a flip-flop for enabling or disabling the counter and latch according as the synchronous signal or sampling clock signal is inputted.

Thus, detecting the phase difference between the horizontal synchronous signal and the sampling clock signal according to a high frequency clock signal, the frequency divisional value of the PLL is adjusted to change the frequency of the sampling clock signal, thus making the A/D converter correctly convert the analog video signal to the digital video signal.

To achieve these and other objects in accordance with the principles of the present invention, as embodied and broadly described, the present invention provides an apparatus, comprising: a video display conveying varying visual information to a user; a first clock unit generating a first clock signal with a first frequency corresponding to a synchronous signal received from a host; a detector unit receiving said first clock signal and said synchronous signal, detecting a phase difference between said first clock signal and said synchronous signal, and outputting phase difference data; a comparator receiving delay data corresponding to said synchronous signal and receiving said phase difference data, comparing said delay data with said phase difference data, and outputting a correction signal; a control unit receiving said correction signal from said comparator, said control unit outputting said delay data to said comparator, said control unit performing one of increasing a frequency divisional value and decreasing said frequency divisional value, said increasing of said frequency divisional value and said decreasing of said frequency divisional value corresponding to an adjustment of said first frequency of said first clock signal in response to said correction signal; and a converter converting an analog video signal received from the host into a corresponding digital video signal in response to said first clock signal, and outputting said digital video signal to said video display, said digital video signal corresponding to the visual information.

To achieve these and other objects in accordance with the principles of the present invention, as embodied and broadly described, the present invention provides a video display apparatus, comprising: a first clock unit generating a first clock signal with a first frequency corresponding to a synchronous signal received from a host; a detector unit receiving said first clock signal and said synchronous signal, detecting a phase difference between said first clock signal and said synchronous signal, and outputting phase difference data; a comparator receiving delay data corresponding to said synchronous signal and receiving said phase difference data, comparing said delay data with said phase difference data, and outputting a correction signal; a control unit receiving said correction signal from said comparator, said control unit outputting said delay data to said comparator, said control unit performing one of increasing a frequency divisional value and decreasing said frequency divisional value, said increasing of said frequency divisional value and said decreasing of said frequency divisional value corresponding to an adjustment of said first frequency of said first clock signal in response to said correction signal; and a multifunction unit receiving a first video signal from the host and said first clock signal from said clock unit, said multifunction unit converting said first video signal into a second video signal in accordance with said first clock signal, said second video signal corresponding to varying visual information conveyed to a user.

To achieve these and other objects in accordance with the principles of the present invention, as embodied and broadly described, the present invention provides a video display apparatus, comprising: a first clock unit generating a first clock signal with a first frequency corresponding to a synchronous signal received from a host; a detector unit receiving said first clock signal and said synchronous signal, detecting a phase difference between said first clock signal and said synchronous signal, and outputting phase difference data; a comparator receiving delay data corresponding to said synchronous signal and receiving said phase difference data, comparing said delay data with said phase difference data, and outputting a correction signal; a control unit receiving said correction signal from said comparator, said control unit outputting said delay data to said comparator, said control unit performing one of increasing a frequency divisional value and decreasing said frequency divisional value, said increasing of said frequency divisional value and said decreasing of said frequency divisional value corresponding to an adjustment of said first frequency of said first clock signal in response to said correction signal; and a multifunction unit receiving an analog video signal from the host and receiving said first clock signal, said multifunction unit converting said analog video signal into a digital video signal in accordance with said first clock signal, said digital video signal corresponding to varying visual information, said multifunction unit conveying the varying visual information to a user.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to exemplify the principles of this invention.

DETAILED DESCRIPTION OF THE PREFERRED EMBODIMENT

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
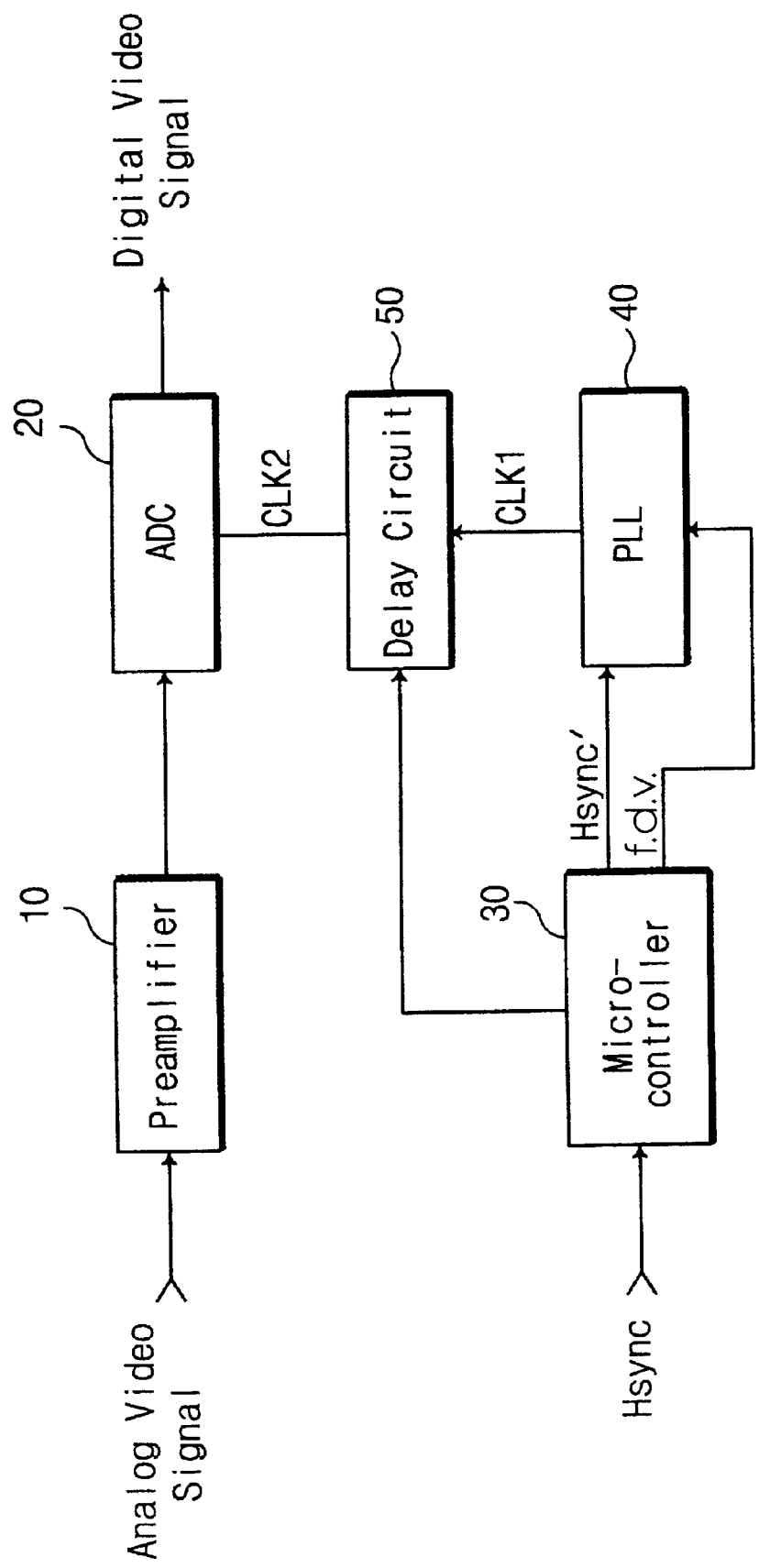
FIG. 1 is a block diagram for illustrating the circuit structure connected with the coarse control in a flat panel display apparatus.
Figure 2:
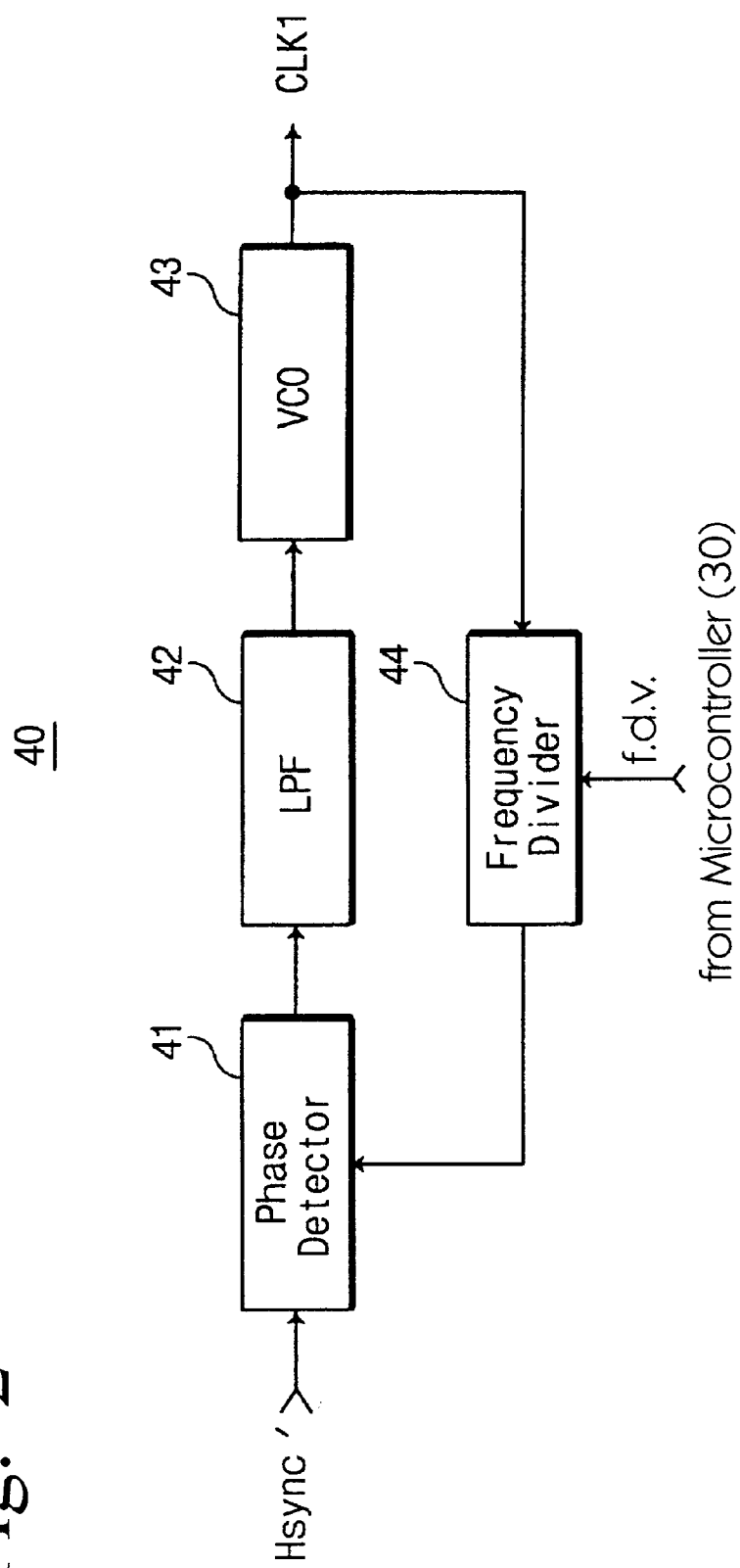
FIG. 2 is a block diagram of the phase locked loop as shown in FIG. 1.

Describing coarse control with reference to FIGS. 1 and 2, an analog video signal supplied from a host (not shown) is amplified by a preamplifier 10, converted by the A/D converter (ADC) 20 into a digital video signal. The horizontal synchronous signal Hsync is delivered to a microcontroller 30, which generates a frequency divisional value (f.d.v.) corresponding to the present display mode to a sampling clock generator 40 consisting of phase locked loop (PLL), which includes, as shown in FIG. 2, a phase detector 41, low pass filter (LPF) 42, voltage controlled oscillator (VCO) 43 and a frequency divider 44. The frequency divider 44 receives the frequency divisional value from the microcontroller 30 to change the frequency of the sampling clock signal CLK1. The frequency divisional value is in compliance with the standards of VESA.

However, when the video card mounted in the host is not in compliance with the standard of VESA, the microcontroller can not provide a correct frequency divisional value. In this case, the user may perform the coarse control by manually operating a coarse control key. Of course, if the frequency of the sampling clock signal CLK1 is not set correctly due to some unknown problems, the coarse control key may be used to perform the coarse control. However, it is very hard for the user to manually perform such coarse control.

Figure 3:
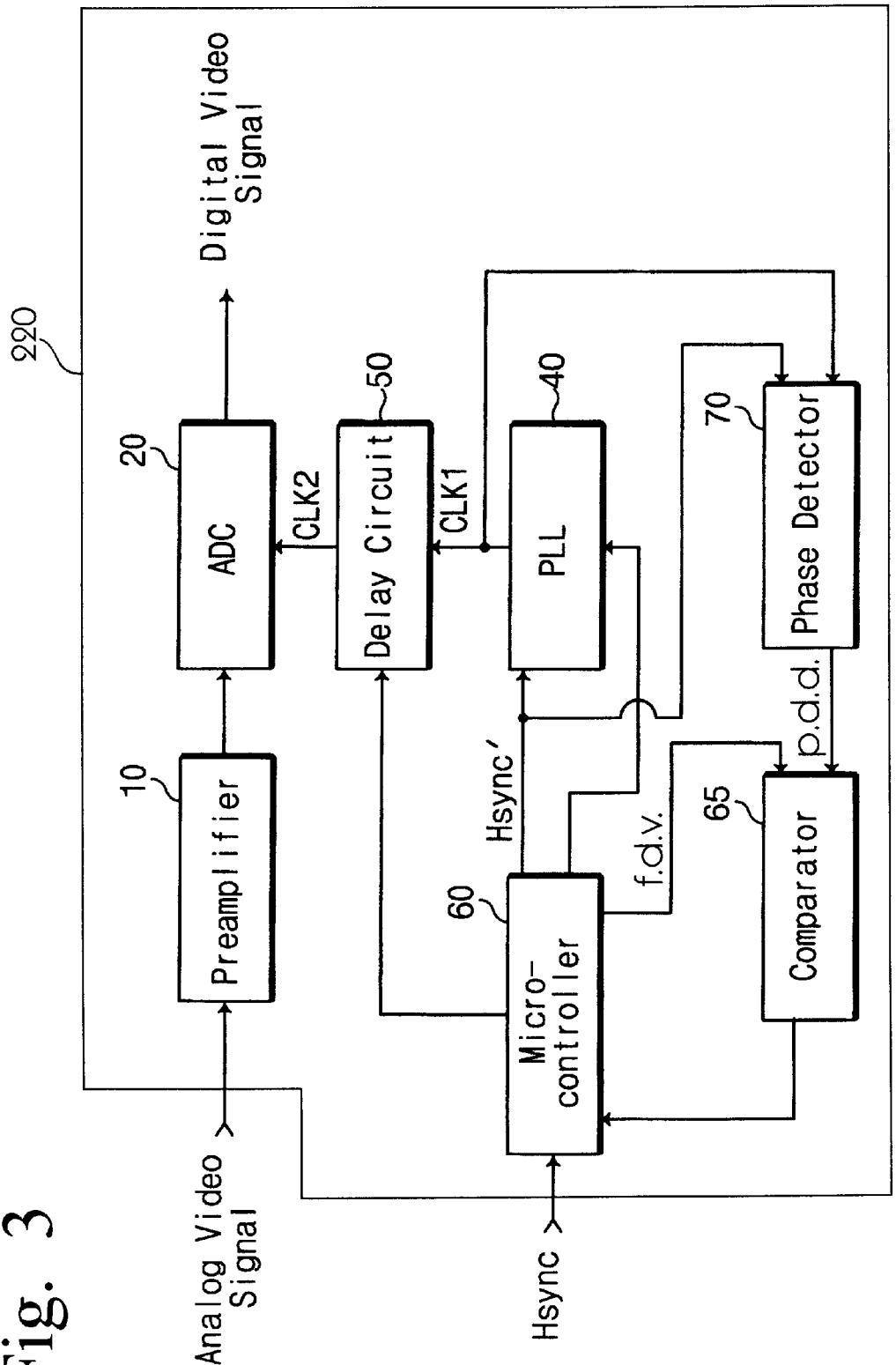
FIG. 3 is a block diagram for illustrating the circuit structure connected with an automatic coarse control in an inventive flat panel display apparatus, in accordance with the principles of the present invention.

Referring to FIG. 3, the novel flat display apparatus employs a phase detector 70 for detecting the phase difference between a horizontal synchronous signal Hsync' applied to a sampling clock generator 40 and the sampling clock signal CLK1 of the sampling clock generator 40 to adjust the frequency of the sampling clock signal CLK1 according to the present display mode. The flat panel display apparatus comprises a flat panel display 220, preamplifier 10, A/D converter 20, delay circuit 50, sampling clock generator 40 consisting of phase locked loop (PLL), and a micro-controller 60. There are further provided according to the present invention the phase detector 70 and comparator 65. Receiving a horizontal synchronous signal Hsync from a host (not shown), the micro-controller 60 provides a frequency divisional value (f.d.v.) to the sampling clock generator 40 according to the present display mode. The sampling clock generator 40 generates a sampling clock signal CLK1 based on the frequency divisional value and horizontal synchronous signal Hsync' from the micro-controller 60. The sampling clock signal CLK1 is delayed by the delay circuit 50 to form a delayed sampling clock signal CLK2. The delayed sampling clock signal CLK2 is then supplied to the A/D converter 20, which converts an analog video signal from the host to a digital video signal in response to the delayed sampling clock signal CLK2.

Figure 4:
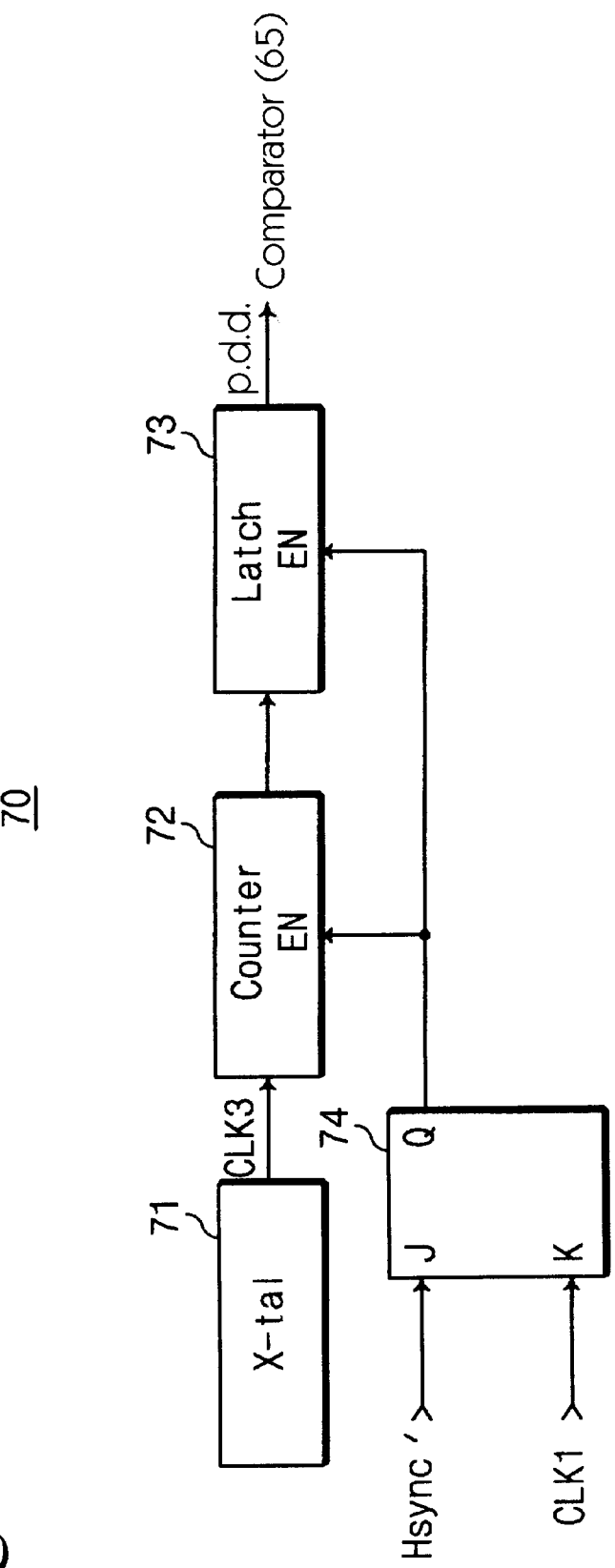
FIG. 4 is a block diagram of the phase detector as shown in FIG. 3.
Figure 5:
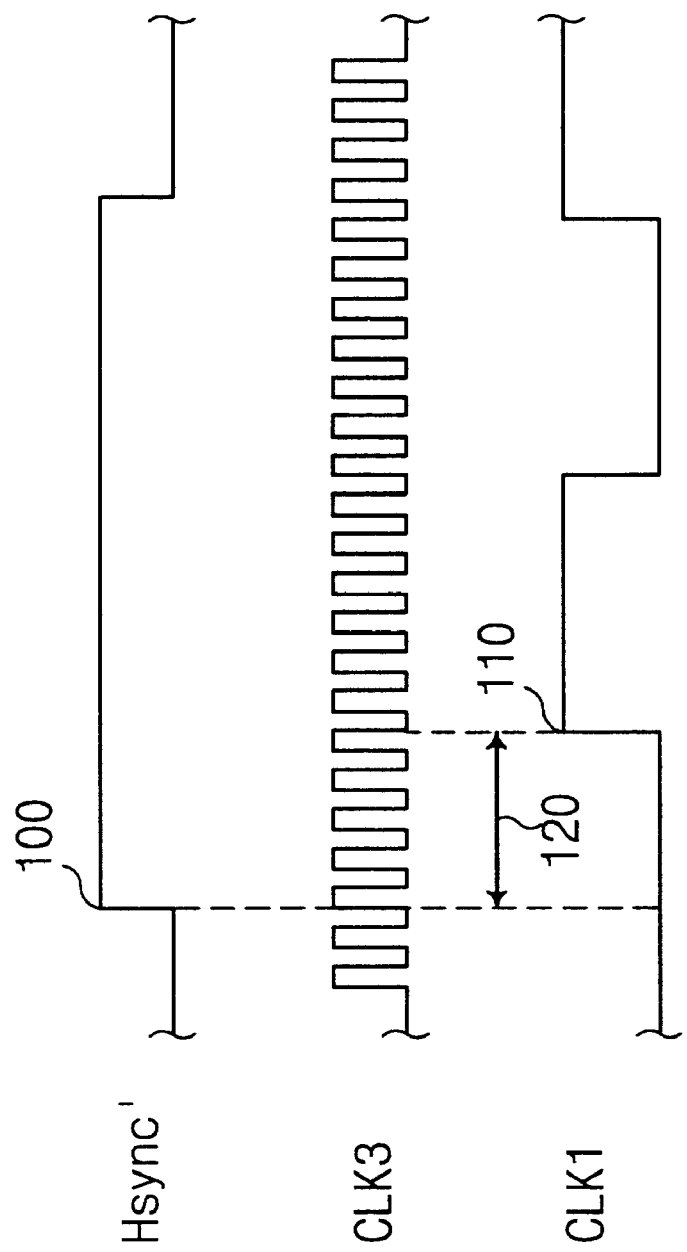
FIG. 5 is a waveform for illustrating the operation of detecting the phase difference between the horizontal synchronous signal and the sampling clock signal.

Meanwhile, the horizontal synchronous signal Hsync' and the sampling clock signal CLK1 are also applied to the phase detector 70, which detects the phase difference between the two signals to generate a phase difference data (p.d.d.) applied to the comparator 65. The phase detector 70 comprises, as shown in FIG. 4, a high frequency clock generator 71 for generating a high frequency clock signal CLK3 with a higher frequency than that of the sampling clock signal CLK1, a counter 72 for counting the high frequency clock signal CLK3, latch 73 for latching the output of the counter 72 and a JK flip-flop 74 for enabling the latch 73. The JK flip-flop 74 works based on the horizontal synchronous signal Hsync' as the J-input and the sampling clock signal CLK1 as the K-input, as shown in FIG. 5. When the horizontal synchronous signal Hsync' goes from low level to high level, as indicated by reference numeral 100 in FIG. 5, the J-K flip-flop 74 generates an enable signal to the counter 72 and latch 73. Then, the counter 72 begins to count the high frequency clock signal CLK3 supplied from the high frequency clock generator 71. The resultant data of the counter 72 is latched by the latch 73. Subsequently, when the sampling clock signal CLK1 goes from low level to high level as indicated by reference numeral 110, the counter 72 stops the counting operation. As indicated by reference numeral 120, the resultant data (hereinafter referred to as 'phase difference data') of the counting operation represents the phase difference between the horizontal synchronous signal Hsync' and the sampling clock signal CLK1, latched by the latch 73.

Figure 6:
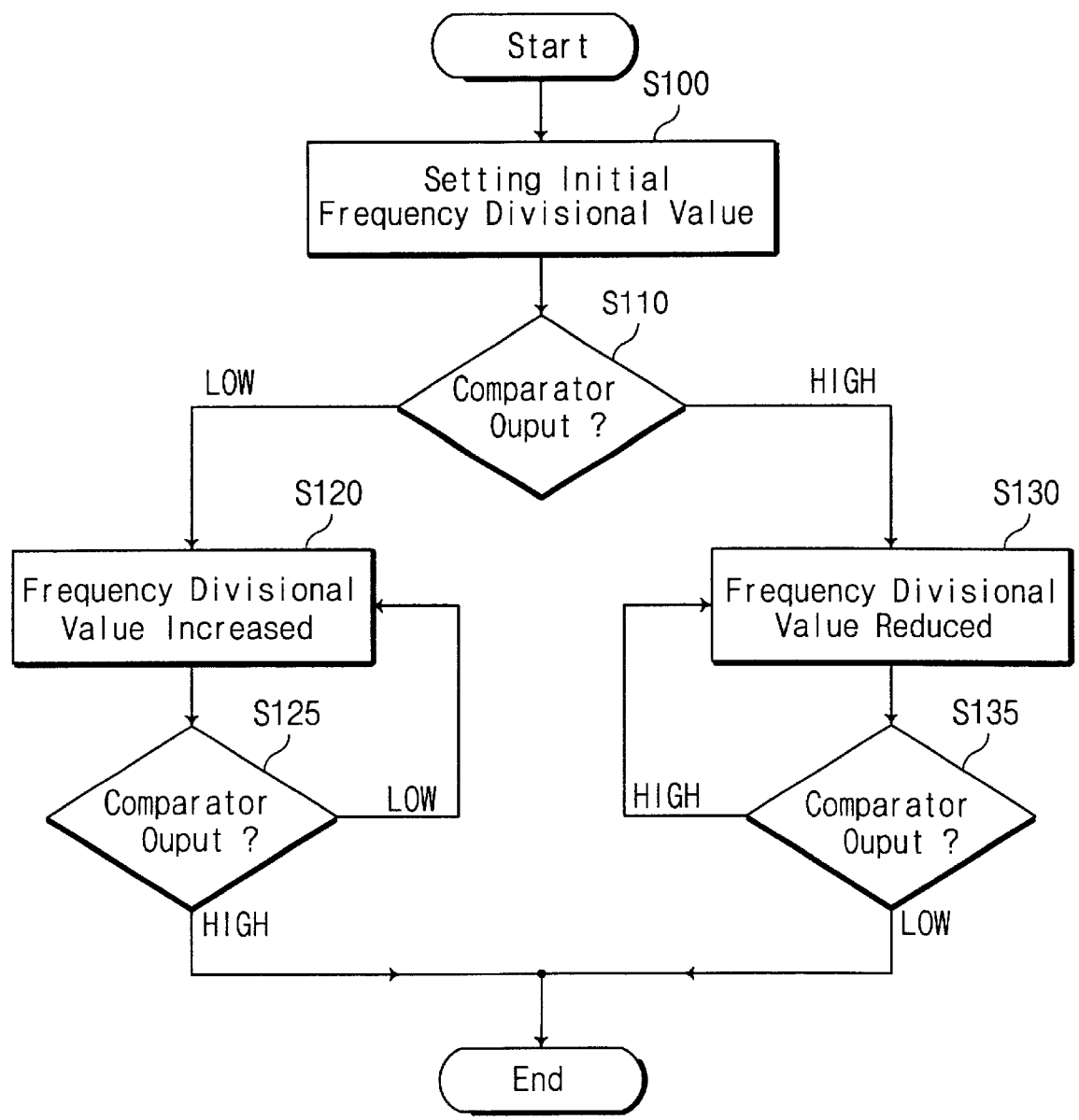
FIG. 6 is a flow chart for illustrating the control steps of the micro-controller as shown in FIG. 3.

Then, the phase difference data from the latch 73 is compared by the comparator 65 with a reference data from the micro-controller 60 to generate a control data. In response to the control data from the comparator 65, the micro-controller 60 increases or decreases the frequency divisional value transmitted to the sampling clock generator 40 to adjust the frequency of the sampling clock signal CLK1, as shown in the flow chart of FIG. 6. In step S100, the micro-controller 60 sets the initial frequency divisional value applied to the sampling clock generator 40 according to the present display mode determined by the horizontal synchronous signal Hsync from the host. The sampling clock generator 40 generates the sampling clock signal CLK1 with a frequency corresponding to the initial frequency divisional value. The phase detector 70 and comparator 65 work as described above. The phase detector 70 can also be referred to as a detector unit 70. The horizontal synchronous signal Hsync from the host can be referred to as a first synchronous signal. The signal Hsync' from the micro-controller 60 can be referred to as a second synchronous signal. The micro-controller 60 can be referred to as a control unit 60. Particular components can be grouped together to correspond to a single multifunction unit. For example, preamplifier 10 and converter 20 can be together considered as a multifunction unit.

The signal transmitted from the control unit 60 to the comparator 65 can be referred to as delay data or reference data. The output transmitted from the comparator 65 to the micro-controller 60 can be referred to as control data, a correction signal, or a resultant compared value. The reference data can be in response to the delay control signal transmitted from micro-controller 60 to delay circuit 50, the Hsync signal, the Hsync' signal, or the control data, for example. In step S110, when the resultant compared value of the comparator 65 is found low, the process goes to step S120 to increase the frequency divisional value by a unit amount, and then to step S125. If the resultant compared value continues to be found low in step S125, the process returns to step S120. However, if the resultant compared value is found high in step S125, the automatic coarse control is ended. Alternatively, in step S110, if the resultant compared value is found high, the process goes to step S130 to reduce the frequency divisional value by a unit amount, and then to step S135. Likewise, if the resultant compared value is found high in step S135, the process returns to step S130. Or otherwise, if it is found low, the process is ended.

The inventive automatic coarse control may be carried out by externally working a coarse adjustment key mounted on the flat panel display apparatus, or by automatic detection of the display mode. Particularly, when the inventive coarse control is connected with a host provided with a video card not supporting the VESA mode, it may automatically adjust the sampling frequency.

The inventive automatic coarse control is not limited to one type of a display apparatus. For example, the inventive automatic coarse control can be utilized with a cathode ray tube, a liquid crystal display, a gas-plasma display, a light emitting diode display, an electro-luminescent display, a field emission display, and other types of display devices.

The aforementioned host can correspond to a computer system such as a desktop computer or a portable computer, wherein a portable computer can be a notebook computer or a laptop computer or a palm-sized computer.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An apparatus, comprising:
   a video display conveying varying visual information to a user;
   a first clock unit receiving a second synchronous signal corresponding to a first synchronous signal, said first clock unit generating a first clock signal with a frequency corresponding to said second synchronous signal;
   a comparator receiving delay data and receiving phase difference data corresponding to a phase difference detected between said first clock signal and said second synchronous signal, comparing said delay data with said phase difference data, and outputting a correction signal in dependence upon said comparing;
   a control unit receiving said correction signal from said comparator and receiving said first synchronous signal, said control unit outputting said delay data to said comparator, said control unit performing one of increasing a frequency divisional value and decreasing said frequency divisional value, said increasing of said frequency divisional value and said decreasing of said frequency divisional value corresponding to an adjustment of said frequency of said first clock signal in response to said correction signal, said control unit outputting said second synchronous signal to said first clock unit; and
   a converter converting a received analog video signal into a corresponding digital video signal in response to said first clock signal, said digital video signal corresponding to the visual information.

2. The apparatus of claim 1, said first clock unit including a phase locked loop adjusting said frequency of said first clock signal according to said frequency divisional value output from said control unit.

3. The apparatus of claim 1, further comprising a detector unit, said detector unit comprising:
   a second clock unit generating a second clock signal having a frequency higher than said frequency of said first clock signal generated by said first clock unit;
   a counter counting said second clock signal;
   a latch latching an output of said counter; and
   a flip-flop unit being connected to said counter and said latch, said flip-flop unit receiving said first clock signal and said second synchronous signal, said flip-flop circuit performing one of enabling said counter and latch and disabling said counter and latch in accordance with said first clock signal and said second synchronous signal, said detector unit performing said detecting of said phase difference and outputting said phase difference data to said comparator.

4. The apparatus of claim 1, further comprising a detector unit, said detector unit comprising:
   a second clock unit generating a second clock signal having a frequency higher than said frequency of said first clock signal generated by said first clock unit;
   a counter having a first input terminal, an enabling input terminal, and an output terminal, said counter receiving said second clock signal at said first input terminal, said counter counting said second clock signal;
   a latch having a first input port, an enabling input port, and an output port, said latch latching output received at said first input port from said output terminal of said counter; and
   a flip-flop unit having a first input unit receiving said first clock signal, a second input unit receiving said second synchronous signal, and an output unit coupled with said enabling input terminal of said counter and said enabling input port of said latch, said flip-flop unit enabling said counter and latch in response to said first clock signal and said second synchronous signal, and said flip-flop unit disabling said counter and latch in response to said first clock signal and said second synchronous signal, said detector unit performing said detecting of said phase difference and outputting said phase difference data to said comparator.

5. The apparatus of claim 1, further comprising a detector unit, said detector unit comprising:
   a counter counting a second clock signal, said second clock signal having a frequency higher than said frequency of said first clock signal;
   a latch latching an output of said counter; and
   a flip-flop unit being connected to said counter and said latch, said flip-flop unit receiving said first clock signal and said second synchronous signal, said flip-flop circuit performing one of enabling said counter and latch and disabling said counter and latch in accordance with said first clock signal and said second synchronous signal, said detector unit performing said detecting of said phase difference and outputting said phase difference data to said comparator.

6. The apparatus of claim 5, further comprising a second clock unit supplying said second clock signal.

7. The apparatus of claim 1, further comprising a detector unit, said detector unit comprising:
   a counter having a first input terminal, an enabling input terminal, and an output terminal, said counter receiving a second clock signal at said first input terminal, said counter counting said second clock signal, said second clock signal having a frequency higher than said frequency of said first clock signal;

a latch having a first input port, an enabling input port, and an output port, said latch latching output received at said first input port from said output terminal of said counter; and a flip-flop unit having a first input unit receiving said first clock signal, a second input unit receiving said second synchronous signal, and an output unit coupled with said enabling input terminal of said counter and said enabling input port of said latch, said flip-flop unit enabling said counter and latch in response to said first clock signal and said second synchronous signal, and said flip-flop unit disabling said counter and latch in response to said first clock signal and said second synchronous signal, said detector unit performing said detecting of said phase difference and outputting said phase difference data to said comparator.

8. The apparatus of claim 6, said first synchronous signal and said analog video signal being received from a host.

9. The apparatus of claim 1, said video display corresponding to a display selected from among a cathode ray tube, a liquid crystal display, a gas-plasma display, a light emitting diode display, an electro-luminescent display, and a field emission display.

10. A video display apparatus, comprising:
a first clock unit generating a first clock signal with a frequency corresponding to a received first synchronous signal;

a detector unit receiving said first clock signal and a second synchronous signal, detecting a phase difference between said first clock signal and said second synchronous signal, and outputting phase difference data in dependence upon said detected phase difference;

a comparator receiving delay data and receiving said phase difference data, comparing said delay data with said phase difference data, and outputting a correction signal in dependence upon said comparing;

a control unit receiving said correction signal from said comparator, said control unit outputting said delay data to said comparator, said control unit performing one of increasing a frequency divisional value and decreasing said frequency divisional value, said increasing of said frequency divisional value and said decreasing of said frequency divisional value corresponding to an adjustment of said frequency of said first clock signal in response to said correction signal; and a converter unit receiving a first video signal and said first clock signal, said converter unit converting said first video signal into a second video signal in accordance with said first clock signal, said second video signal corresponding to varying visual information conveyed to a user.

11. The apparatus of claim 10, further comprising:
a video display unit receiving said second video signal and conveying the varying visual information to the user.

12. The apparatus of claim 11, said converter unit corresponding to an analog-to-digital converter, said first video signal corresponding to an analog video signal, and said second video signal corresponding to a digital video signal.

13. The apparatus of claim 11, said video display unit corresponding to a display selected from among a cathode ray tube, a liquid crystal display, a gas-plasma display, a light emitting diode display, an electro-luminescent display, and a field emission display.

14. The apparatus of claim 10, said correction signal output from said comparator corresponding to one of a high signal and a low signal, said control unit performing said increasing of said frequency divisional value when said correction signal corresponds to said low signal, and said control unit performing said decreasing of said frequency divisional value when said correction signal corresponds to said high signal.

15. A video display apparatus, comprising:
a first clock unit generating a first clock signal with a frequency corresponding to a received first synchronous signal;

a detector unit receiving said first clock signal and a second synchronous signal, detecting a phase difference between said first clock signal and said second synchronous signal, and outputting phase difference data;

a comparator receiving delay data and receiving said phase difference data, comparing said delay data with said phase difference data, and outputting a correction signal; and a control unit receiving said correction signal from said comparator, said control unit outputting said delay data to said comparator, said control unit performing one of increasing a frequency divisional value and decreasing said frequency divisional value, said increasing of said frequency divisional value and said decreasing of said frequency divisional value corresponding to an adjustment of said frequency of said first clock signal in response to said correction signal;

said video display apparatus receiving an analog video signal from the host, converting said analog video signal into a digital video signal in accordance with said first clock signal, said digital video signal corresponding to varying visual information, said video display apparatus conveying the varying visual information to a user.

16. The apparatus of claim 15, said first clock unit including a phase locked loop adjusting said first frequency of said first clock signal according to said frequency divisional value output from said control unit.

17. The apparatus of claim 15, said detector unit further comprising:
a second clock unit generating a second clock signal having a frequency higher than said frequency of said first clock signal generated by said first clock unit;

a counter counting said second clock signal;

a latch latching an output of said counter; and a flip-flop unit being connected to said counter and said latch, said flip-flop unit receiving said first clock signal and said second synchronous signal, said flip-flop circuit performing one of enabling said counter and latch and disabling said counter and latch in accordance with said first clock signal and said second synchronous signal.

18. The apparatus of claim 15, said detector unit further comprising:
a counter counting a second clock signal, said second clock signal having a frequency higher than said frequency of said first clock signal generated by said first clock unit;

a latch latching an output of said counter; and a flip-flop unit being connected to said counter and said latch, said flip-flop unit receiving said first clock signal and said second synchronous signal, said flip-flop circuit performing one of enabling said counter and latch and disabling said counter and latch in accordance with said first clock signal and said second synchronous signal.

19. The apparatus of claim 15, further comprising;

an analog-to-digital converter performing converting of said analog video signal into said digital video signal; and a flat panel display unit performing conveying of the varying visual information to the user, said flat panel display unit being in communication with said analog-to-digital converter.

20. The apparatus of claim 15, said correction signal output from said comparator corresponding to one of a high signal and a low signal, said control unit performing said increasing of said frequency divisional value when said correction signal corresponds to said low signal, and said control unit performing said decreasing of said frequency divisional value when said correction signal corresponds to said high signal.

\* \* \* \* \*